United States Patent [19]
Brankner

[11] Patent Number: 5,928,964
[45] Date of Patent: Jul. 27, 1999

[54] SYSTEM AND METHOD FOR ANISOTROPIC ETCHING OF SILICON NITRIDE

[75] Inventor: Keith J. Brankner, Richardson, Tex.

[73] Assignee: Texas Instruments Incorporated, Dallas, Tex.

[21] Appl. No.: 08/769,680

[22] Filed: Dec. 18, 1996

[51] Int. Cl.⁶ ............................... C01B 33/00; C07F 7/02
[52] U.S. Cl. ........................ 438/714; 438/724; 438/345
[58] Field of Search ................................. 216/2; 156/643; 438/714, 345, 724

[56] References Cited

U.S. PATENT DOCUMENTS

| | | | |
|---|---|---|---|
| 4,264,409 | 4/1981 | Forget et al. | 156/643 |
| 4,820,377 | 4/1989 | Davis et al. | 156/643 |
| 4,820,378 | 4/1989 | Loewenstein | 156/643 |

*Primary Examiner*—Paula K. Hutzell
*Assistant Examiner*—Timothy A. Worrall
*Attorney, Agent, or Firm*—Carlton H. Hoel; Warren L. Franz; Richard L. Donaldson

[57] ABSTRACT

A system and method is provided for anisotropically etching a silicon nitride layer (12) in an ion-assisted plasma reactor. A chuck (34) supports a photoresist layer (10), the silicon nitride layer (12), and a semiconductor water (14). A chuck temperature controller (36) is provided for adjusting the temperature of the chuck (34) to either increase or decrease the etch bias of the silicon nitride layer (12) to achieve an optimal etch bias.

8 Claims, 3 Drawing Sheets

5,928,964

SYSTEM AND METHOD FOR ANISOTROPIC ETCHING OF SILICON NITRIDE

TECHNICAL FIELD OF THE INVENTION

This invention relates in general to the field of semiconductors and more particularly to an improved system and method for anisotropically etching silicon nitride.

BACKGROUND OF THE INVENTION

During the fabrication of some integrated circuits, a moat opening may be formed, within which is grown a field isolation oxide to electrically separate active areas of the semiconductor wafer. A transistor may be formed in each active area, and each transistor is electrically isolated from the other by the field isolation oxide layer. This method of oxidation is known as local oxidation of silicon (LOCOS).

A field isolation oxide layer can be grown in a semiconductor wafer by first forming a layer of silicon nitride ($Si_3N_4$) over the semiconductor wafer. A photolithographic mask is applied to the silicon nitride layer, and the exposed silicon nitride layer is etched away in the areas corresponding to the openings in the photolithographic mask. The photolithographic mask may comprise a photoresist layer. The exposed portions of the silicon nitride layer may be etched away using reactive ion etch techniques. After the exposed portions of the silicon nitride layer are removed, the photoresist layer is removed, and a field isolation oxide layer is grown in the etched openings of the silicon nitride layer. After the growth of the field isolation oxide layer, the silicon nitride layer is removed, leaving a field isolation oxide layer serving as an isolation structure between two active regions of the semiconductor wafer.

The etch bias of an etched silicon nitride opening is the difference between the width of the etched silicon nitride opening and the corresponding opening in the photoresist mask. An optimal etch bias is zero, indicating that the silicon nitride opening and the initial photoresist mask opening are the same width. A positive etch bias indicates that the etched silicon nitride opening is wider than the corresponding opening in the photoresist mask.

Problems encountered when etching the moat opening include the difficulty of achieving an etch bias of zero. In order to accurately create field isolation oxide layers, the process of etching the silicon nitride must accurately reproduce the dimensions of the photoresist mask in the silicon nitride layer. The dimensions of the etched moat opening in the silicon nitride layer must ideally be the same as the initial dimensions of the corresponding opening in the overlaying photoresist mask. Thus, for design purposes, it is important that the moat openings in the silicon nitride layer have predictable dimensions.

The etching of the silicon nitride layer is often accomplished in an ion-assisted plasma reactor. During the etching process, the chemical content of the plasma may erode the sidewalls of the photoresist mask opening. The gradual and continued erosion of the sidewalls of the photoresist layer widens the openings in the photoresist mask, thus providing a wider angle for ion bombardment in the reactor. Increased ion bombardment on the sidewalls of the photoresist layer and the silicon nitride layer leads to increased erosion of the sidewalls of the photoresist layer and the silicon nitride layer and results in a silicon nitride etch with an undesirably high etch bias.

Inaccurate etching of the silicon nitride layer is often exacerbated by the seasoning of the plasma reactor. The chemical content, or seasoning, of the walls of the plasma reactor changes after each etch, thereby hindering the accuracy of the silicon nitride etch.

SUMMARY OF THE INVENTION

Therefore, a need has arisen for a method for anisotropically etching a layer of silicon nitride through a photoresist mask according to the initial dimensions of the photolithographic mask. In accordance with the present invention, a system and method for anisotropically etching a silicon nitride layer is provided that substantially eliminates or reduces the disadvantages associated with previously developed methods for anisotropically etching silicon nitride. The silicon nitride etching system and method of the present invention comprises a halocarbon/oxidant reactive ion etch conducted in a plasma reactor.

A chuck in the plasma reactor supports the semiconductor wafer, silicon nitride layer, and photoresist mask. The process of measuring the etch bias of the silicon nitride layer and adjusting the chuck temperature controller in response to the measured etch bias comprises a feedback control loop for monitoring the etch bias of the silicon nitride layer and adjusting the temperature of the chuck to either decrease or increase the etch bias of the silicon nitride etch.

An important technical advantage of the present invention is the provision of a silicon nitride etching process having a feedback loop able to monitor the etch bias of the silicon nitride etch and adjust the chuck temperature to either increase or decrease the chuck temperature to achieve an optimal etch bias.

BRIEF DESCRIPTION OF THE DRAWINGS

A more complete understanding of the present invention and the advantages associated therewith may be acquired by referring to the accompanying drawings in which like reference numbers indicate like features and wherein.

DETAILED DESCRIPTION OF THE INVENTION

Figure 1:
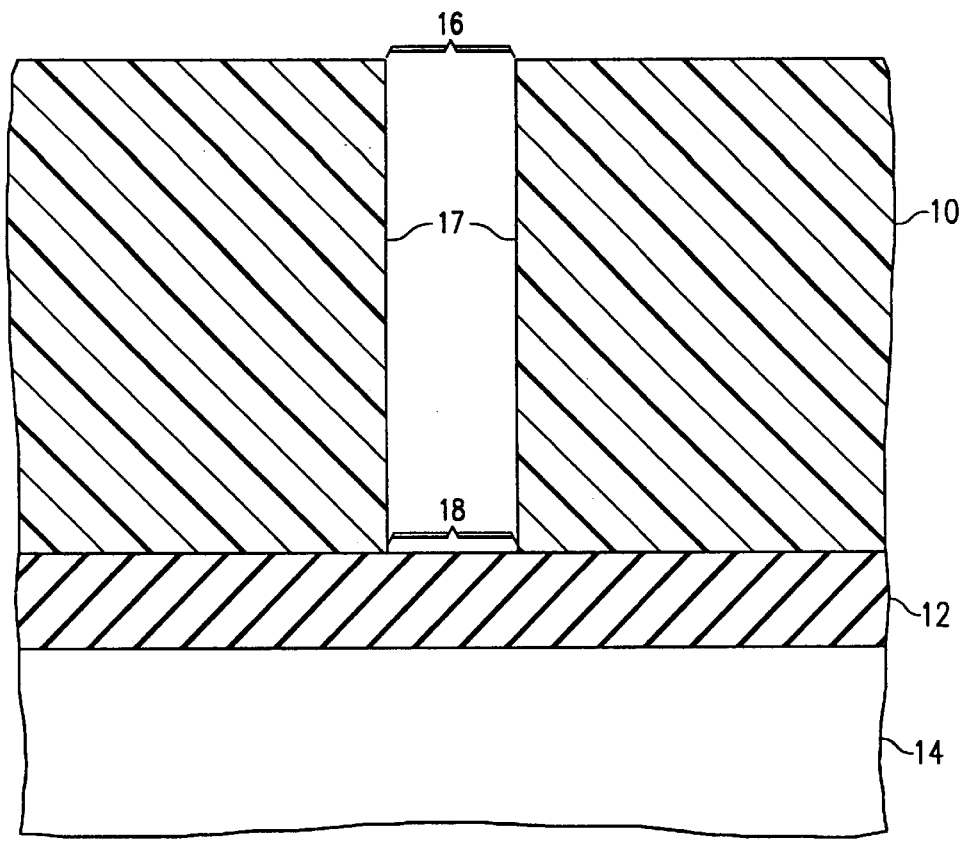
FIG. 1 is a cross-sectional graphical representation of a photoresist mask overlaying a silicon nitride layer and a semiconductor wafer.

FIG. 1 is a cross-sectional graphical representation of a photoresist layer 10 formed on a silicon nitride ($Si_3N_4$) layer 12. Silicon nitride layer 12 is formed on semiconductor wafer 14. Silicon nitride layer 12 may be formed on an oxide layer formed on semiconductor wafer 14. Semiconductor wafer 14 may comprise, for example, silicon, with or without an oxide layer formed thereon. Photoresist layer 10 has a photoresist mask opening 16. Within photoresist mask opening 16 are the internal sidewalls 17 of the photoresist layer 10. In order to reproduce the lateral dimensions of photoresist mask opening 16 in silicon nitride layer 12, an exposed area 18 of silicon nitride layer 12 is anisotropically etched away by magnetically enhanced reactive ion etching (MERIE). The reactive ion etching process may be performed in a plasma reactor such as the Applied Materials P5000E plasma reactor. The environment of the plasma reactor is characterized by the reaction of ionic gases and semiconductor materials.

Figure 2:
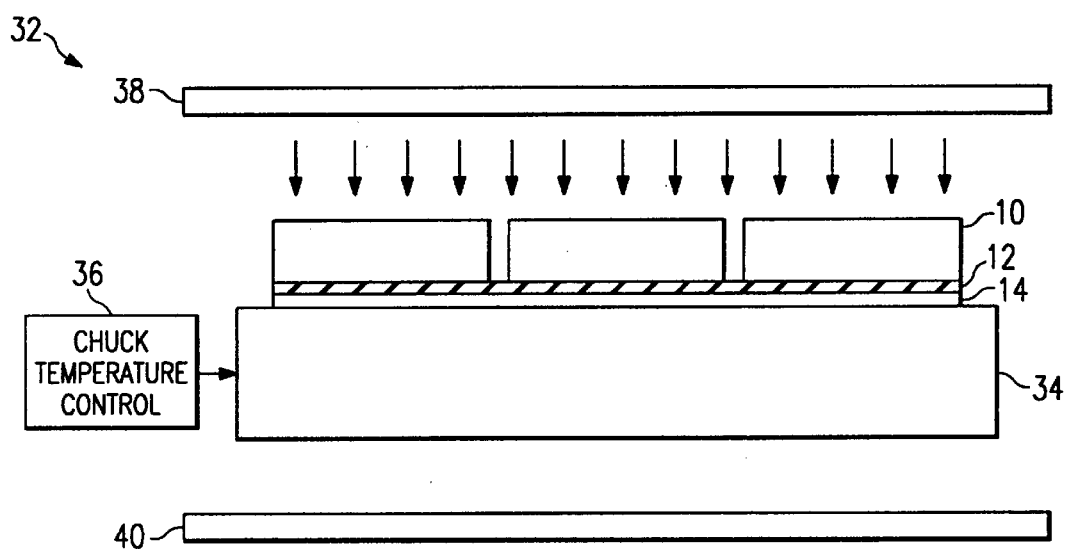
FIG. 2 is a cross-sectional graphical representation of one embodiment of an ion-assisted plasma reactor constructed according to the teachings of the present invention.

An embodiment of a plasma reactor indicated generally at 32 is shown in FIG. 2. Plasma reactor 32 may be a parallel plate reactor having an upper parallel plate 38 and a lower parallel plate 40. A chuck 34 supports semiconductor wafer 14, silicon nitride layer 12, and photoresist layer 10 in plasma reactor 32 during the reactive ion etching process. Ion energy in halocarbon/oxidant plasma reactor 32 is directed from upper plate 38 to semiconductor wafer 14.

The temperature of chuck 34 is adjustable by a chuck temperature controller 36 coupled to chuck 34. The etch bias of silicon nitride layer 12 is a measurement of the degree to which the width of an etch of silicon nitride layer 12 is either larger than (a positive etch bias) or smaller than (a negative etch bias) the corresponding photoresist mask opening 16 of photoresist layer 10.

Chuck temperature controller 36 is adjustable to control the temperature of chuck 36. The temperature of chuck 34 is one of several process parameters of plasma reactor 32 that affect the resulting etch bias of the etched silicon nitride layer 12. An increase in the etch bias from a room temperature of 20° Centigrade to a temperature of 40° Centigrade reduces the etch bias. Further increases in the temperature of chuck 34 may, however, result in a negative etch bias, indicating that the width of the etched silicon nitride is smaller than the width of the corresponding photoresist mask opening 16.

Chuck temperature controller 36 is externally adjustable by a control mechanism located external to the interior of plasma reactor 32. The process of measuring the etch bias of silicon nitride layer 12 and adjusting chuck temperature controller 36 in response to the measured etch bias comprises a feedback loop for adjusting the temperature of chuck 34 according to the etch bias of silicon nitride layer 12.

Figure 3:
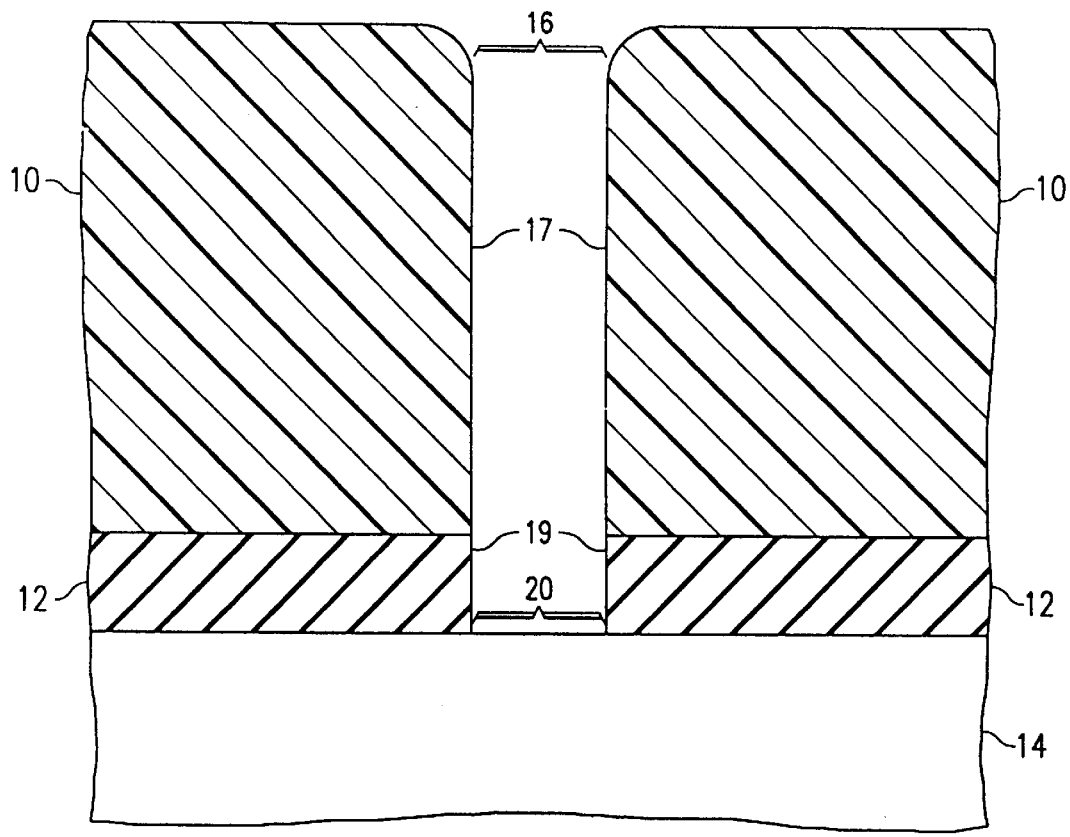
FIG. 3 is a view of the wafer of FIG. 1 after the etching of the silicon nitride layer.

The result of the anisotropic etching of silicon nitride layer 12 is shown in FIG. 3, in which silicon nitride opening 20 is the opening formed by the ion-assisted etching of silicon nitride layer 12. The etch bias of the etched silicon nitride is the difference between the silicon nitride opening 20 and photoresist mask opening 16. An etch bias of zero indicates that the width of the photoresist mask opening 16 is the same as that of the silicon nitride opening 20. A negative etch bias indicates that the width of silicon nitride opening 20 is smaller than the width of photoresist mask opening 16.

Limiting the enlargement of the lateral dimensions of photoresist mask opening 16 and silicon nitride opening 20 during the etching of silicon nitride layer 12 can be accomplished by adjusting the temperature of chuck 34 so that the temperature of chuck 34 is either raised or lowered to either decrease or increase the etch bias of silicon nitride layer 12.

During the etching process, because of the repeated ion bombardment in plasma reactor 12 and the chemical nature of the etch, the sidewalls 17 of photoresist layer 10 gradually erode. The eroded portions of photoresist layer 10 combine with the plasma to form polymers that bind themselves to sidewalls 17 and 19 of photoresist layer 10 and silicon nitride layer 12. The attachment of the polymers to sidewalls 17 and 19 increases the sidewall passivation of sidewalls 17 and 19 and raises the etch bias of the silicon nitride etch.

A reduction in the etch bias of silicon nitride layer 12 can be accomplished by increasing the temperature of chuck 34. The sidewall passivation of sidewalls 17 and 19 is reduced by an increase in the temperature of chuck 34. As polymers are created by the reaction of photoresist layer 10 and the plasma, an elevated temperature in chuck 34 imparts greater energy to the polymers, preventing the buildup of the polymers on sidewalls 17 and 19. The etch bias of etched silicon nitride layer 12 is optimally zero at a temperature of about 40° Centigrade. Depending, however, on the composition of gases within the plasma of plasma reactor 32, the optimal temperature of chuck 34 may be either higher or lower than 40° Centigrade.

In the case of a positive etch bias, chuck temperature controller 36 is adjusted to raise the temperature of chuck 34. A rise in temperature of chuck 34 provides a higher energy level to any polymers formed by the reaction of the plasma and photoresist layer 12, thereby hindering the ability of the polymers to bind themselves to the sidewalls 17 and 19 of photoresist layer 10 and silicon nitride layer 12.

If the etch bias of the silicon nitride etch becomes negative, chuck temperature controller 36 is adjusted to lower the temperature of chuck 34. A reduction in temperature of chuck 34 allows the formed polymers to more easily bond with sidewalls 17 and 19.

The measurements necessary for determining the etch bias of the silicon nitride etch can be obtained by scanning electron micrograph photographs of (1) photoresist layer 10 after patterning of photoresist layer 10 but before the etch and (2) silicon nitride layer 12 after the etch. After the etch bias is determined, the operator, which may be either a human operator or a software-controlled operator, of plasma reactor 32 adjusts the temperature of chuck 34 by adjusting chuck temperature controller 36. After the temperature of chuck 34 stabilizes, another silicon nitride layer can be etched. For a given plasma reactor, after a number of etches and corresponding chuck temperature adjustments according to the teachings of the present invention, a look-up table or a software-based process controller can be created indicating the chuck temperature adjustment necessary to achieve a near zero etch bias for a given non-zero etch bias.

Figure 4:
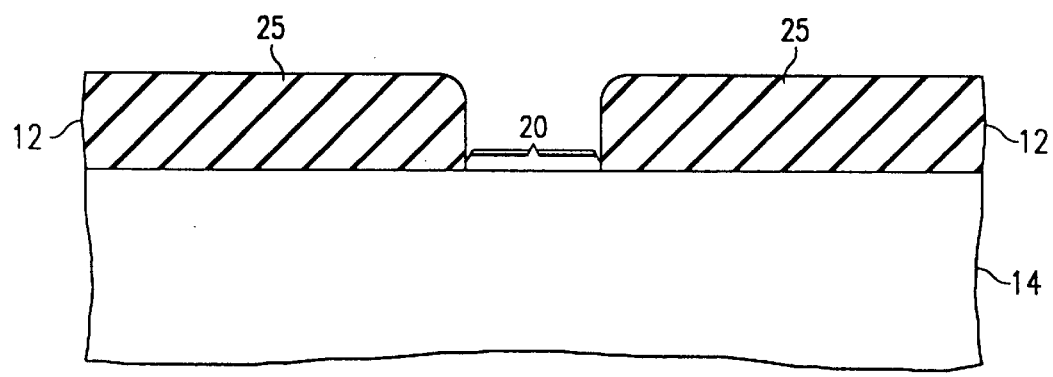
FIG. 4 is a view of the wafer of FIG. 3 after the removal of the photoresist mask.
Figure 5:
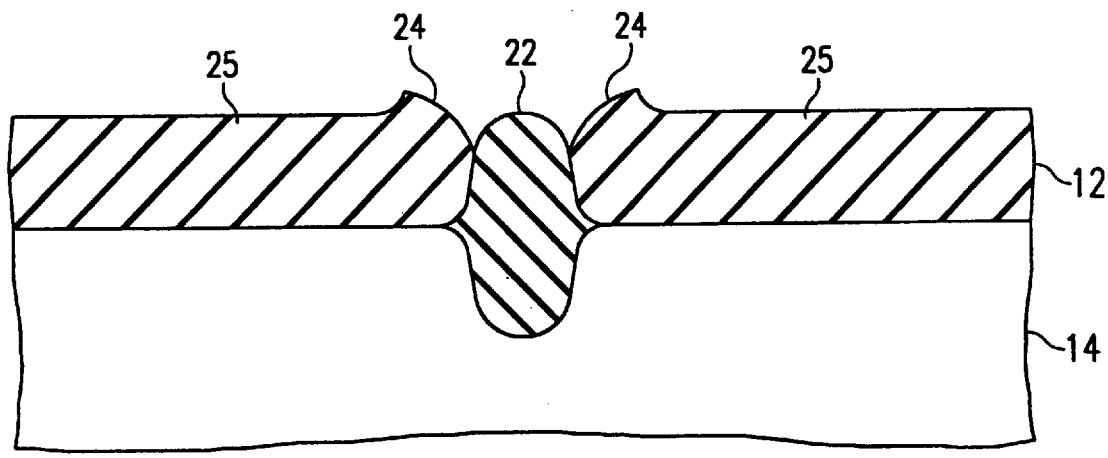
FIG. 5 is a view of the wafer of FIG. 4 after the growth of a field isolation oxide layer in the etched silicon nitride layer.
Figure 6:
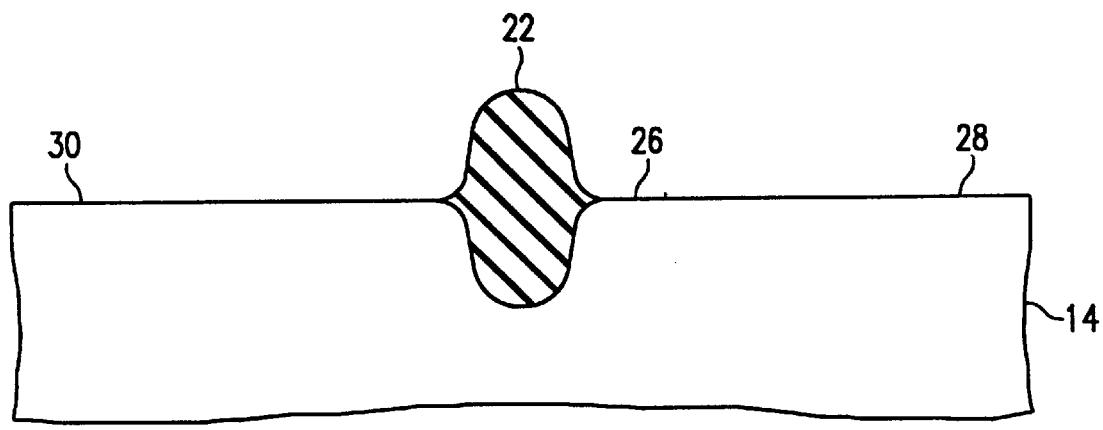
FIG. 6 is a view of the wafer of FIG. 5 after the removal of the silicon nitride layer.

As shown in FIG. 4, after the etching of silicon nitride layer 12 according to the teachings of the present invention, photoresist layer 10 is removed, leaving silicon nitride layer 12 disposed on semiconductor wafer 14. A field isolation oxide layer 22, as shown in FIG. 5, is grown in silicon nitride opening 20. Field isolation oxide layer 22 grows in the lateral direction as well as the vertical direction, resulting in a "bird's beak" structure 24. As shown in FIG. 6, the segments 25 of silicon nitride layer 12 are stripped away leaving semiconductor wafer 14. The top surface 26 of semiconductor wafer 14 has a first active area 28 and a second active area 30 separated by field isolation oxide layer 22.

A transistor may be formed on each active area. Field isolation oxide layer 22 provides for electrical isolation between the transistors formed in first active area 28 and second active area 30. If necessary, the transistors formed on first active area 28 and second active area 30 can later be electrically connected one of several ways, including the application of an overlaid metallization pattern.

Although the present invention has been described in detail, it should be understood that various changes, alterations, and substitutions may be made to the teachings herein without departing from the spirit and scope of the present invention, which is defined solely by the appended claims.

What is claimed is:

1. A system for anisotropically etching silicon nitride, comprising:

a plasma reactor;

a layer of silicon nitride disposed on a semiconductor substrate and housed within the plasma reactor;

a photoresist mask formed on the layer of silicon nitride;

a chuck supporting the semiconductor substrate;

a chuck temperature controller coupled to the chuck for adjusting the temperature of the chuck, wherein the chuck temperature controller is operable to increase the temperature of the chuck in response to a positive etch bias of the silicon nitride layer, and wherein the chuck temperature controller is operable to decrease the temperature of the chuck in response to a negative etch bias of the silicon nitride layer.

2. A method for adjusting the etch bias of an anisotropic etch of a layer of silicon nitride, comprising the steps of:

providing a layer of silicon nitride to be etched;

providing a photolithographic mask formed on the layer of silicon nitride, the photolithographic mask having a photolithographic mask opening;

providing a chuck supporting the layer of silicon nitride and the photolithographic mask;

etching an opening in the layer of silicon nitride corresponding to the photolithographic mask opening;

measuring the etch bias of the silicon nitride openings by comparing the width of the etched silicon nitride opening versus the width of the photolithographic mask opening; and adjusting the temperature of the chuck in response to the measured etch bias.

3. The method for adjusting the etch bias of an anisotropic etch of a layer of silicon nitride of claim 2, wherein the step of adjusting the temperature of the chuck in response to the measured etch bias comprises the step of raising the temperature of the chuck in response to a positive etch bias.

4. The method for adjusting the etch bias of an anisotropic etch of a layer of silicon nitride of claim 2, wherein the step of adjusting the temperature of the chuck in response to the measured etch bias comprises the step of lowering the temperature of the chuck in response to a negative etch bias.

5. The method for adjusting the etch bias of an anisotropic etch of a layer of silicon nitride of claim 2, wherein the step of adjusting the temperature of the chuck in response to the measured etch bias comprises the step of raising the temperature of the chuck in response to a positive etch bias and lowering the temperature of the chuck in response to a negative etch bias.

6. The method for adjusting the etch bias of an anisotropic etch of a layer of silicon nitride of claim 2, further comprising the step of repeating the step of measuring the etch bias and the step of adjusting the temperature of the chuck in response to the measured etch bias following each step of etching an opening in the layer of silicon nitride corresponding to the photolithographic mask opening.

7. The method for adjusting the etch bias of an anisotropic etch of a layer of silicon nitride of claim 2, wherein the step of adjusting the temperature of the chuck in response to the measured etch bias comprises the step of raising the temperature of the chuck in response to a positive etch bias and lowering the temperature of the chuck in response to a negative etch bias; and further comprising the step of repeating the step of measuring the etch bias and the step of adjusting the temperature of the chuck in response to the measured etch bias following each step of etching an opening in the layer of silicon nitride corresponding to the photolithographic mask opening.

8. A method for achieving a zero etch bias of an anisotropic etch of a layer of silicon nitride, comprising the steps of:

providing a layer of silicon nitride to be etched;

providing a photolithographic mask formed on the layer of silicon nitride, the photolithographic mask having a photolithographic mask opening;

providing a chuck supporting the layer of silicon nitride and the photolithographic mask;

etching an opening in the layer of silicon nitride corresponding to the photolithographic mask opening;

measuring the etch bias of the silicon nitride openings by comparing the width of the etched silicon nitride opening versus the width of the photolithographic mask opening;

raising the temperature of the chuck in response to a positive etch bias;

lowering the temperature of the chuck in response to a negative etch bias; and repeating the step of measuring the etch bias, the step of raising the temperature of the chuck in response to a positive etch bias, and the step of lowering the temperature of the chuck in response to a negative etch following the step of etching an opening in the layer of silicon nitride corresponding to the photolithographic mask.

* * * * *

UNITED STATES PATENT AND TRADEMARK OFFICE
CERTIFICATE OF CORRECTION

PATENT NO. : 5,928,964  
DATED : July 27, 1999  
INVENTOR(S) : Keith J. Brankner Page 1 of 1

It is certified that error appears in the above-identified patent and that said Letters Patent is hereby corrected as shown below:

<u>Title page,</u>
Insert Item
-- [60]      Related U.S. Application Data

Provisional Application No. 60/009,777 filed 12/21/1995. --

Signed and Sealed this

Thirteenth Day of January, 2004

JON W. DUDAS
*Acting Director of the United States Patent and Trademark Office*